US007010733B2

(12) United States Patent
Bassett et al.

(10) Patent No.: US 7,010,733 B2
(45) Date of Patent: Mar. 7, 2006

(54) PARAMETRIC TESTING FOR HIGH PIN COUNT ASIC

(75) Inventors: Robert W. Bassett, Essex Junction, VT (US); Garrett S Christensen, Endicott, NY (US); Michael L. Combs, Essex Junction, VT (US); L. Owen Farnsworth, Lincoln, VT (US); Pamela S. Gillis, Jericho, NY (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 10/065,365

(22) Filed: Oct. 9, 2002

(65) Prior Publication Data

US 2004/0073856 A1  Apr. 15, 2004

(51) Int. Cl.
*G01R 31/28* (2006.01)
*G01R 31/02* (2006.01)
*G06F 17/50* (2006.01)

(52) U.S. Cl. ........................... 714/724; 324/754; 716/4
(58) Field of Classification Search ................ 714/724, 714/726, 727; 324/754; 716/4
See application file for complete search history.

(56) References Cited

U.S. PATENT DOCUMENTS

| 4,348,759 A | 9/1982 | Schnurmann ................. 371/20 |
| 4,857,774 A | 8/1989 | El-Ayat et al. ............... 307/465 |
| 5,068,603 A | 11/1991 | Mahoney ................. 324/158 R |
| 5,243,274 A | 9/1993 | Kelsey et al. ............ 324/158 R |
| 5,253,255 A | 10/1993 | Carbine ...................... 371/22.6 |
| 5,369,643 A | 11/1994 | Rastgar et al. ............. 371/15.1 |
| 5,412,260 A | 5/1995 | Tsui et al. ..................... 326/39 |
| 5,513,186 A | 4/1996 | Levitt ......................... 371/22.3 |
| 5,563,830 A | 10/1996 | Ishida .................... 365/189.02 |
| 5,712,858 A | 1/1998 | Godiwala et al. .......... 371/22.1 |
| 5,734,660 A | 3/1998 | Fujisaki ..................... 371/22.3 |
| 5,909,450 A | 6/1999 | Wright ....................... 371/22.1 |
| 6,046,947 A | 4/2000 | Chai et al. ................... 365/201 |
| 6,448,796 B1 * | 9/2002 | Ellison et al. .............. 324/754 |
| 6,556,938 B1 * | 4/2003 | Rohrbaugh et al. ......... 702/117 |
| 6,658,613 B1 * | 12/2003 | Rearick et al. ............. 714/724 |

FOREIGN PATENT DOCUMENTS

EP   0388790   *  9/1990

OTHER PUBLICATIONS

"A Study of the Optimization of DC Parametric Tests" Chang, J.M. International Test Conference 1990 Proceedings: Sep. 10-14, 1990 pp. 478-487 Inspec Accession No.: 3976214.*

Arimilli et al., "Method to Verify Chip-to-Chip Interconnect Within a Hardware System" IBM Technical Disclosure Bulletin, Vo. 36, No. 06A, Jun. 1993, pp. 437-438.

A. D. Savkar, "N-Way Testpoint for Complex LSI Design", IBM Techinical Bulleting, vol. 14, No. 10, Mar. 1972, pp. 2937-2938.

* cited by examiner

*Primary Examiner*—Albert Decady
*Assistant Examiner*—Cynthia Britt
(74) *Attorney, Agent, or Firm*—Anthony J. Canale; Robert A. Walsh (57) ABSTRACT

A method for reducing Pin Count Test design and test that allows parametric test patterns for high pin count ASICs to be applied using low pin count testers. The same boundary scan structure used to isolate the test of internal logic to a small number of test I/O is also used to apply parametric external I/O tests to the ASIC's functional I/O. The parametric tests are banked into pin groups and applied on the same low pin count tester used for the internal logic tests.

10 Claims, 6 Drawing Sheets

PARAMETRIC TESTING FOR HIGH PIN COUNT ASIC

BACKGROUND OF THE INVENTION

1. Field of the Invention

The present invention relates to a method for testing electrical circuit units having a plurality of terminals or pins on a tester that lacks the number of necessary channels to connect one circuit pin to one tester channel. More particularly, this invention relates to the utilization of a tester in which the terminals of an integrated circuit unit under test exceeds by a substantial margin the number of testing lines that the tester has available to make a connection.

2. Background

Reference is made to U.S. Pat. No. 4,348,759 entitled "Automatic Testing Of Complex Semiconductor Components With Test Equipment Having Less Channels Than Those Required By The Component Under Test", granted Sep. 7, 1982 to Henri Schnurmann. The Abstract of the Schnurmann patent reads as follows:

A method and apparatus for testing large or very large scale integrated circuit packages is described. The testing equipment required for testing such packages is assumed to lack the number of channels necessary to connect one channel to each input/output of the unit under test. A computer program classifies all input terminals in a plurality of categories, each of which corresponds to a particular circuit type and electric network configuration connected to that pin. A unique set of DC levels is defined prior to testing for each class of inputs. These voltage levels are supplied by the tester channels, each of which drives a multitude of input pins that belong to the same category. The assignment of tester channels in the aforementioned arrangement is implemented by means of multiplexers that select for each pin the appropriate set of DC levels, and a memory buffer contained in the tester, with the DC test patterns stored wherein. The bit configuration of each pattern controls plural switching devices that deliver the appropriate DC levels to the terminals of the unit.

The practice of testing integrated circuit components is of prime importance to the electronic device manufacturer so as to weed out defective units before they are assembled and used. It is desirable to test semiconductor devices while they are still part of a wafer so as to discover unsatisfactory components prior to being mounted on the next level of packaging. Similarly, it is also desirable to test further these integrated circuit units after they have been assembled on modules, cards or boards. Only by means of repetitive testing can the quality assurance of the devices be safeguarded. This continuous testing at each level of packaging imposes demands on the electronic industry to design and provide equipment that is capable of performing these tests in an automatic mode, at high speeds and with precise accuracy.

The trend of the electronic industry developments is to further increase the degree of miniaturization of electronic devices. This implies decreasing the area of each circuit which, in turn, allows for an increase in the density of circuits. A higher circuit count permits more logic functions to be performed by the integrated unit. This trend towards miniaturization is also accompanied by a corresponding increase in the number of terminal pins. This is necessary to maintain adequate communication between the circuitry of the unit and the remainder of the assembly or machine which it is part of.

As integrated circuits become more sophisticated, the complexity of the supporting test equipment must increase correspondingly. This signifies a rapid increase of the number of tests that must be performed to locate all the faults in the integrated circuit. For example, on a simple integrated circuit of no more than a dozen circuits, at most, several tens of tests are sufficient to locate all possible failures. In today's integrated circuits, containing hundreds and thousands of circuits, the number of tests required is in the order of many tens of thousands to achieve the same result. Not only the software requirements to generate such test patterns are difficult, but the time needed to apply them is inordinately long. A direct consequence of this trend toward miniaturization is that the test equipment must be able to process a large number of patterns at high speed. Such an electronic tester is usually controlled by a computer. The tester generates a signal that is provided to the integrated circuit or assembly, hereinafter referred to interchangeably as a unit under test (UUT). This signal which is in the form of a forced voltage or current is supplied to the appropriate input terminal pin by an electronic network called "digital-to-analog converter" or "D/A converter". This, and other pertinent circuitry forms a "tester channel". As the name suggests, it converts a "logic binary level" into an electrical analog level which is applied to a single input terminal of the unit under test (UUT). In a similar fashion, the actual electrical response at the output pins of the UUT is compared to a standard acceptable response by the computer. These responses are dictated by the test patterns. For example, if the expected binary level at one output pin of the UUT is a "logic 1", the tester, by use of the channel connected to that output pin, will measure the voltage or current level. A nonconcurrence between the measured and expected levels indicates the presence of a failure inside of the integrated circuit, and the unit is discarded as defective.

Today, a one to one correspondence between each tester channel and a terminal pin of a UUT always exists. By presetting each tester channel to a defined level, it is possible to assign a voltage or current level appropriate to each terminal connection. The prior art, however, has not solved the problem when the tester falls behind the advances in the complexity of the semiconductor technology and when an inadequate number of tester channels are present to service the totality of terminal pins of the UUT.

SUMMARY OF THE INVENTION

To overcome many of the above-mentioned shortcomings and to provide a practical system to match a large or very large scale integrated circuit package (LSI or VLSI) with terminal pins in excess over the available number of tester, channels, the present invention provides, as its primary object, a method for banking parametric test patterns for high pin count ASIC designs which are applied to low pin count testers.

Another object of the invention is to allow complete parametric fault coverage to be retained which allows high quality testing on low pin count testers.

In effect, this invention provides an advance over the prior art by enabling a tester with fewer channels than those required by the integrated circuit package to actually test this package as if an adequate number of channels were available. This invention provides that tester channels can be multiplexed to "banked" sets of terminal pins containing with input receivers and/or output drivers without requiring that the banked sets of terminal pins share a common circuit type and electric network configuration. In particular, this invention is useful to test large scale integrated packages that represent the latest advances in technology with existing test equipment whose architecture and characteristics have not fully matched the advances in semiconductor technology packages.

The present invention is based on the use of a product-design-specific Test Manufacturing Data (TMD) file which is required for each ASIC logic product design. Since the TMD file is design-specific, creation of this file is typically the designer's responsibility. The TMD file contains a number of design-specific elements, including a complete gate-level logic model of the design and all the design-specific test patterns required to verify correct fabrication of the design.

For ASIC products that conform to Boundary Scan Design, the TMD contains reduced pin count test (RPCT) patterns for the logic circuitry, cores, and embedded memory that are internal to a boundary scan chain. These test patterns use a reduced number of the product pins, called test I/O, that allow these Internal Tests to be applied using a low pin count tester. The TMD also includes an explicit External I/O test pattern subset that is used to test the logical and parametric functionality of the off-chip driver and receiver circuits that fall outside of the logical enclosure created by the boundary scan logic structure. These External I/O test patterns are generated under the assumption that all of the product's signal I/O pins will be simultaneously contacted during the test. This assumes the External I/O test patterns will be applied by a full pin count tester with as many test channels as the product has signal I/O pins. Although the internal tests can be applied with a low pin count tester, this assumes the External I/O tests would still require the high pin count tester.

Presently, when products have pin counts and volumes that exceed the capacity of existing testers, expensive new higher pin count testers must be used. Future technology offerings will lead to products with even higher pin counts. Since RPCT is used for the Internal test patterns, banking the External I/O test patterns can avoid the use of high pin count testers by allowing both Internal and External I/O test patterns to be applied on existing lower pin count testers.

The ASIC boundary scan design supports reduced pin testing in a fashion similar to IEEE Standard 1149.1, published in 1990 by the IEEE Standard Test Access Port and Boundary Scan Architecture. In ASIC boundary scan design the scan chains have a dedicated test access port which separates the device test into two testable regions. The region internal to the boundary scan chain consists of all the logic circuitry, embedded memory, and cores. This internal region can be fully tested using a reduced number of test pins consisting of test control inputs, scan chain I/O, and test I/O. The region external to the boundary scan chain contains die same internal test controls and I/O. It also includes all the external I/O pins. These are all the remaining functional and data I/O on the product.

Most external I/O are bi-directional pins with their receiver, driver, and driver enable wired directly to separate latches in the boundary scan chain. These I/O are wired independently of other external I/O. Each of these external I/O can be tested individually by using only the one external I/O, the RPCT test I/O, and the boundary scan chain. Alternately, given their independence, the tests of several external I/O can be merged and tested together by the same test pattern.

There are also specialized external I/O books that are dependent on other external I/O. Differential I/O have a true pin and a complement pin. During a receiver test, the true and complement pins must receive opposite binary stimuli. Both pins must receive these simultaneous stimuli during their test patterns. The differential I/O pins must be tested together.

Some external I/O books are dependent on a voltage reference sourced from the tester through another external input. The reference input must be held at the required voltage for any External I/O tests that involve an I/O using the reference voltage. There are sometimes large numbers of External I/O (e.g., 200) using the reference voltage. The most practical way to satisfy this requirement is to have the voltage reference input pins active for the test of any group of the external I/O pins.

The region external to the boundary scan chain contains minimal logic circuitry consisting of the I/O receiver and driver controls and the wiring of the external I/O data lines to multiplexers and the boundary scan chain. This external region can be fully tested using the test controls, boundary scan chain and the external I/O pins. The external region can be tested using an I/O Wrap test. I/O Wrap test patterns latch stimuli from the boundary scan chain, wrap the stimuli through the bidirectional external I/O, and observe the result by capturing it back in the boundary scan chain. Since there is little circuitry under test in this region, a small number of the I/O Wrap test patterns are required. In addition to the I/O Wrap test, External I/O tests can be used to test the off-chip drivers and on-chip receivers within the external I/O books. The External I/O tests also have a rather simple structure requiring a relatively small number of test patterns.

The Automatic Test Pattern Generator (ATPG) for the External I/O tests targets special parametric faults; faults to specifically test off-chip drivers and receivers. The ATPG tool also segregates the external logic (that connected to the External I/O plus the necessary test control logic). By targeting only the parametric faults and using only the external logic, the ATPG patterns are very structured and very simple, either applying tester stimulus to the External input pins; and observing them in the boundary latches, or measuring the output of the External drivers after applying the driver enable and data signals from the boundary scan latches.

The ATPG additionally generates a few patterns to test any remaining stuck faults in the external logic, such as the boundary scan multiplexers. These patterns are also very simple and structured due to the nature of the boundary scan.

Figure 1A:
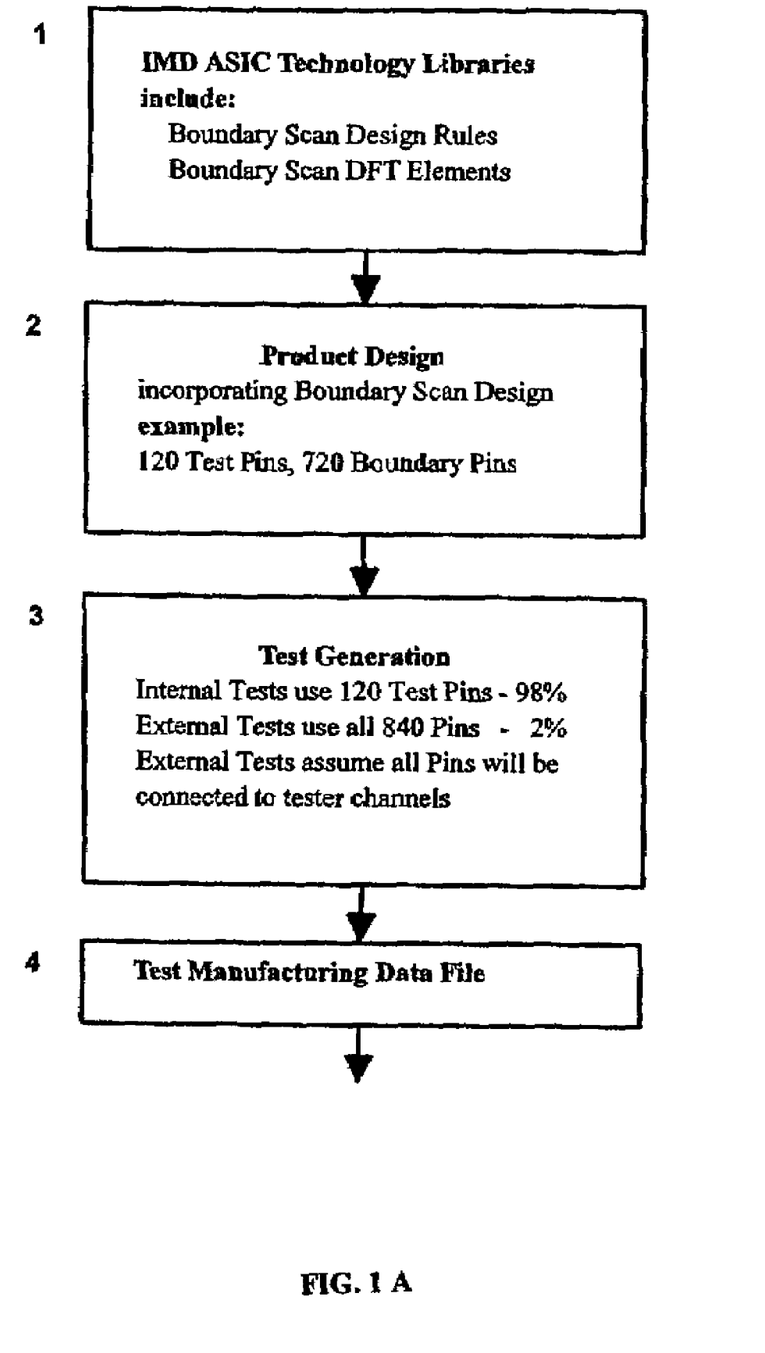
FIG. 1 is a flow diagram of the present invention.
Figure 1B:
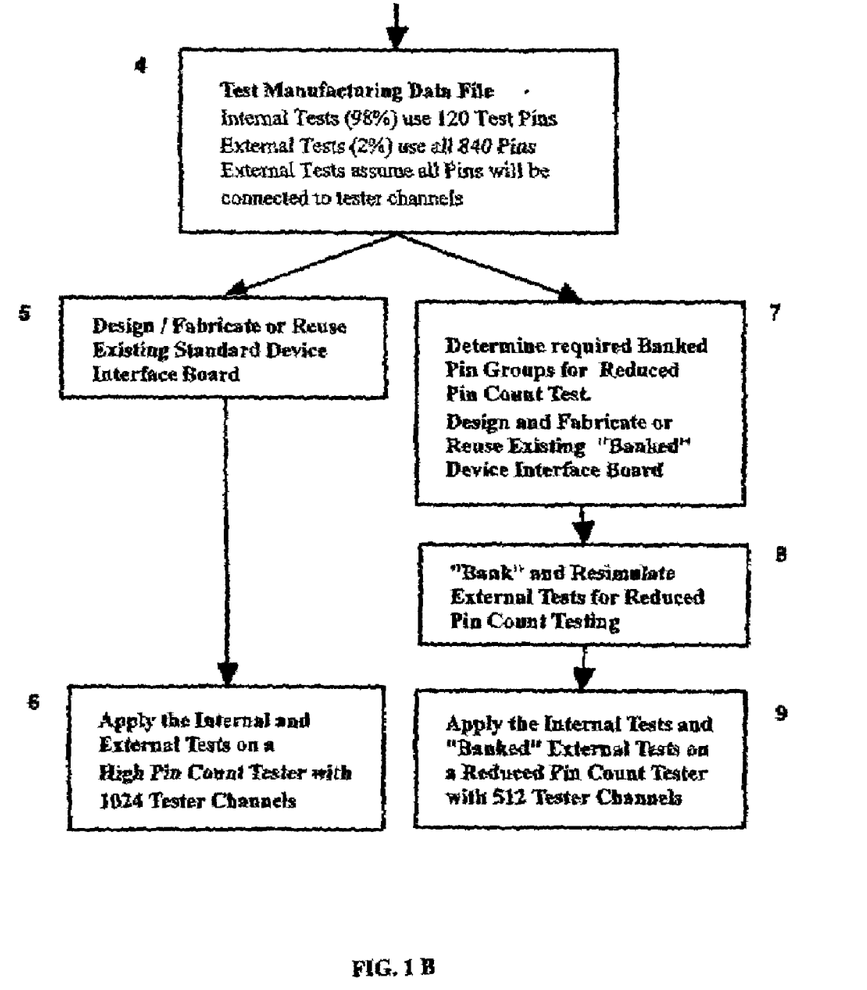
Figure 1C:
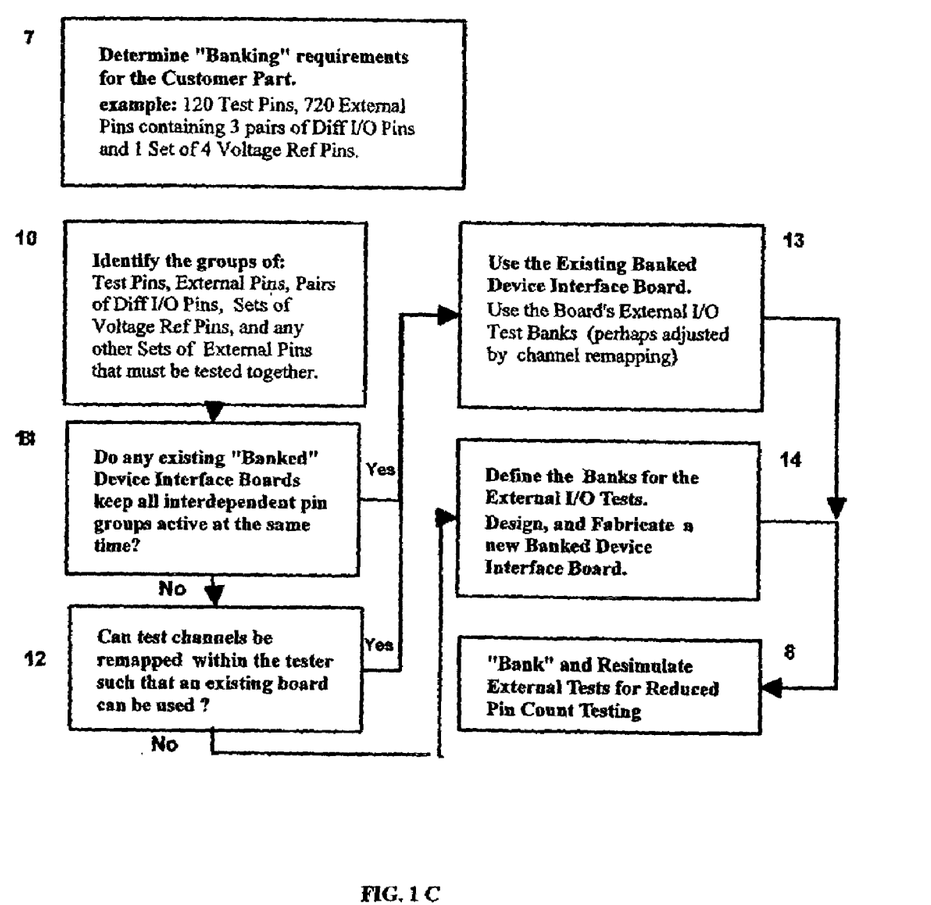
Figure 1D:
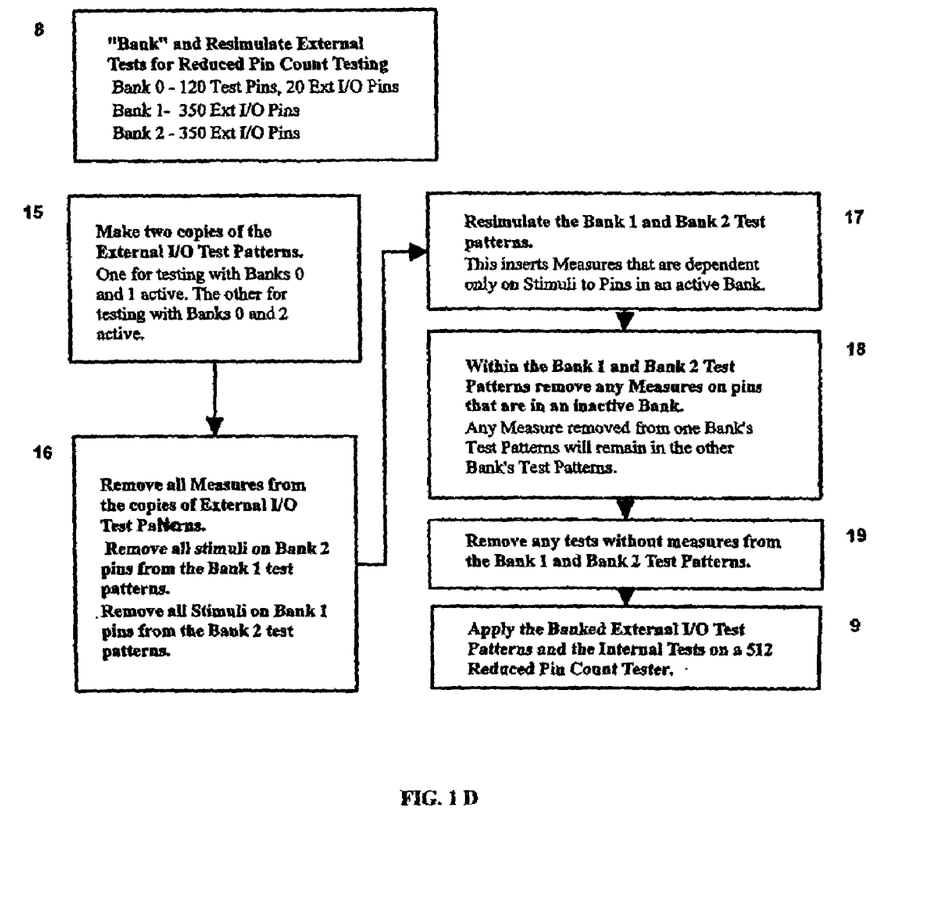
Figure 2:
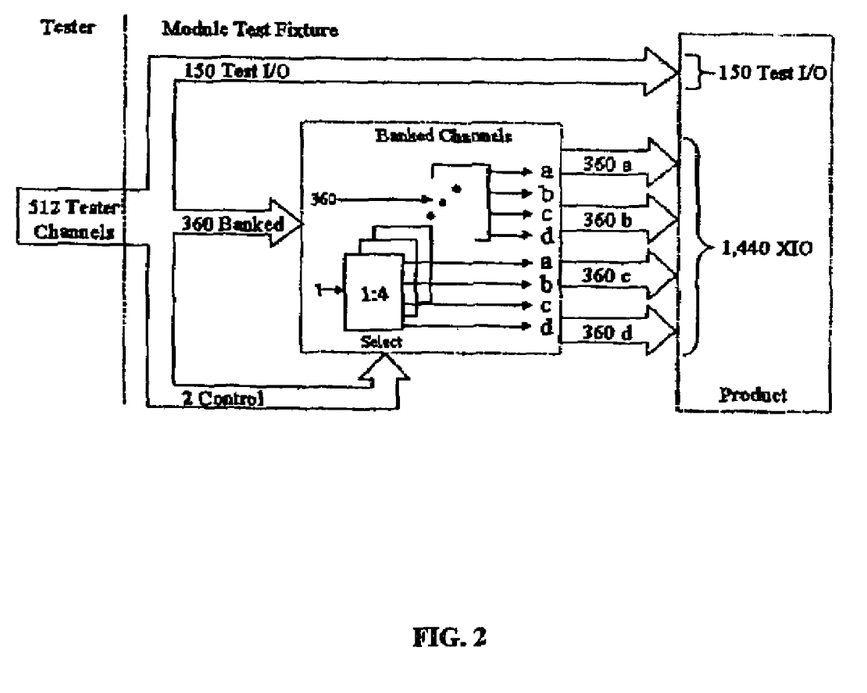
FIG. 2 is a drawing of a banking example of the present invention.

The present invention involves a method known as "banking," which switches a predefined group of tester channels between "active" (connected) and "inactive" (unconnected) groups of pins on an integrated circuit and allocates groups of I/O pins to specific tester channels. One banking technique is to implement it directly on a module test fixture, which mates the integrated circuit to the tester. As an example, as shown in FIG. 2, a module test fixture with banking can extend a tester with 512 tester channels to test a product with 1,592 test pins. To begin, 150 testerchannels could be fixed to always contact 150 of the product's pins to handle the RPCT test I/O. Configuring the banking can use a 1:4 multiplexer. Two tester channels are needed to control the banking multiplexer on the module test fixture. The remaining 360 tester channels can be switched between four banked groups. Each banked group, when active, would connect to 360 external I/O pins on the product. The 1:4 multiplexed banking extends the 360 tester channels to support testing of 1,440 products pins. Therefore, the 150 fixed channels plus the 360 channels banked to four groups extends the 512 pin tester to test products with up to 1,590 pins.

Figure 3:
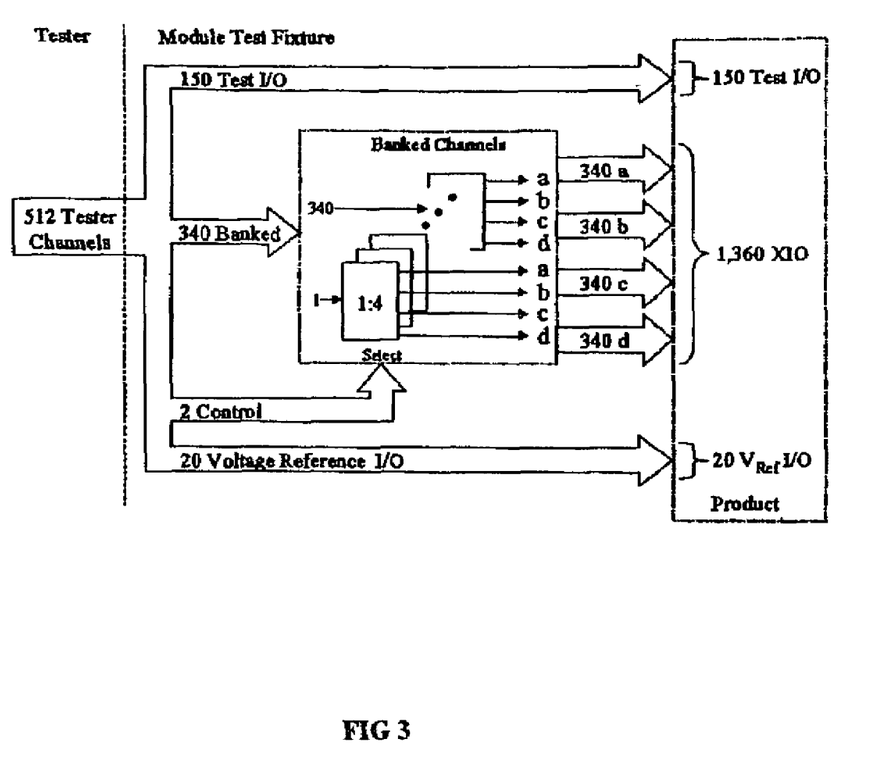
FIG. 3 is a drawing of a more complex banking example with voltage reference pins in accordance with the present invention.

A more complex example, as shown in FIG. 3, could include testing a product that has both voltage references and differential I/O. For instance, the above example could be modified to include 20 product voltage references and one differential I/O that resides outside the 150 test I/O. Once again the 150 product test I/O are fixed to always contact 150 tester channels; the 20 voltage references are treated in the same manner. A total of 170 tester channels have now been accounted for, this leaves 342 channels to act as banked channels and as the control for the banked channels. Allowing two channels for control provides 340 tester channels capable of contacting 1,360 product pins. This is accomplished by configuring the banking switches as 1:4 multiplexers. With this approach, the total product pin count that can be tested by a 512 pin tester is 1,530 pins. To address the differential I/O requirement, the differential I/O true and complement pins must be paired by connecting them to the same port on two different multiplexers. This will insure that both pins of the Differential I/O are connected and unconnected to the tester as pair.

The present invention is better understood upon consideration of the following description and the accompanying drawing.

DETAILED DESCRIPTION OF THE INVENTION

The present invention enables testing of new high pin count products on existing testers with fewer lest pins. This invention works with all types of I/O standards, including differential I/O and I/O requiring reference voltages. There is no loss of parametric fault coverage, allowing high quality rest while avoiding the capital and production costs associated with purchasing and operating a high pin count testers.

As a starting point, the present invention utilizes a product-design-specific Test Manufacturing Data (TMD) file for each ASIC logic product design. The TMD file contains a complete gate-level logic model of the design and all the test patterns required to verify correct fabrication of the design.

For ASIC products that conform to Boundary Scan Design Rules, these test patterns include an explicit External I/O test pattern subset that is used to test the logical and parametric functionality of the off-chip driver and receiver circuits that fall outside of the logical enclosure created by the boundary scan logic structure. These External I/O test patterns are generated under the assumption that all of the product's signal I/O pins will be simultaneously contacted during test. Presently, application of these External I/O test patterns requires a full pin count tester with as many test channels as the product has signal I/O pins.

The cost of Automatic Test Equipment (ATE) has a direct relationship to the number of test channels on the tester. Presently, when products have pin counts and volumes that exceed the capacity of existing testers, expensive higher pin count testers must be purchased. Future technology offerings will lead to products with even higher pin counts. Banking External I/O test patterns can avoid the purchase of these new testers by allowing such products to be tested on existing lower pin count testers.

Automatic Test Pattern Generation (ATPG) can be used to bank the External I/O test patterns such that they can be applied on the low pin count testers using a banked module test fixture. The ATPG of External I/O test patterns for earlier banking methods assumed that only one external I/O pin could receive a stimulus during execution of a test pattern. For every external I/O pin, the three receiver parametric tests of logic 1 and 0 were each generated as a separate test pattern. The driver parametric test patterns were allowed to measure any number of pins. Manufacturing test could then organize the receiver tests into the banked pattern sets conforming to the banked pin groups defined by the module test fixture. The receiver tests were banked into pattern sets, each containing the tests for the pins in a banked group. The driver tests were included in all the grouped pattern sets. Voltage measurements during the driver tests were ignored when the measured pin was not active in a particular group. Since every External I/O pin was active in at least one group, every pin's receiver and driver tests are applied by one of the banked pattern groups. The complete independence of the external I/O pins and their test patterns also allowed banked module test fixtures to be shared by products with the same physical size and image.

The earlier banking methods were made obsolete by the evolving ASIC technology offerings. Earlier, it had allowed stimulus to be applied to, at most, one external I/O pin by each test within the External I/O test patterns. Repeat ASIC Technologies introduced differential I/O pins and special voltage reference I/O pins. During the External I/O tests, these special types of external I/O require multiple pins to be simultaneously contacted and to receive stimuli. This complicates the coordination of the customer's test generation and the use of banking for manufacturing test. These special types of interdependent external I/O must be together in one bank. However, an ASIC design and test pattern generation occurs well before the manufacturing module test fixture is defined.

ATPG tools do not support importing information about the physical location of the chip I/O's and their module pin mapping. Test generation uses a logical model of a chip and its I/O. The actual physical location of these I/O on the chip is defined separately by the physical design process. In addition, the secondary mapping of the chip I/O to module pins is defined by yet another process, the design of the module substrate. In some cases, the same product can be packaged on different module substrates.

It is logistically impractical for a test fixture's banking configuration to be 'backed' through the module substrate design and the physical design definition of chip pad locations to the ATPG logical test pins. Hence, it is impractical for the customer's ATPG to have the forward knowledge of how the external I/O pins will be banked by manufacturing. It is after test generation and module substrate definition that manufacturing can best define "banked" pin groups and build a banked module test fixture. The external I/O "banked" pin groups are determined by cross-referencing the ATPG logical test pins to their physical chip pad locations and, in turn, to the module pin locations on the module substrate. The ATPG logical model and the chip and module physical design models are used to determine the fixed physical locations of the multiple pins that need to be simultaneously contacted.

Since the designer's test generation lacks the physical information required to determine banking, the "practical solution" has been to have the ATPG assume all pins would be contacted by a high pin count tester. Prior to this invention that undesired "solution" has required the purchase of high pin count testers to test the higher pin count products.

As manufacturing receives future orders for high pin count and high volume products, the continued economic interest is to minimize capital costs and production costs by testing the product on existing testers or less expensive testers with fewer tester channels than the product has pins. Because of the special I/O pins described above, a customer's test generation for the external I/O tests will continue to be run to with the assumption that the tester will contact all the product pins simultaneously. However, after receiving the rest patterns, manufacturing can use a new banking method to modify the external I/O test patterns such that they can be applied on testers with fewer test channels using custom banked test fixtures or an intermediate banking board.

The banking method used in the present invention handles the measurements performed during the external I/O driver tests in the same fashion as the earlier method. However, by utilizing re-simulation of the suitably modified external I/O test patterns, this method does not restrict the tests to just one stimulus per test pattern on the external I/O pins. Any and all of the pins in the active bank can have stimuli applied by one of the re-simulated test patterns. Since the designer's test generation is done assuming all pins will be contacted then there are many fewer test patterns each containing stimuli on many external I/O pins. Consequently, even after replication of the external I/O test patterns for each bank, the net result is that the modified and re-simulated external I/O test patterns are far fewer in number and will require less time to apply in comparison to the earlier banking methods.

ATPG test generation for the External I/O test patterns will continue to be run with the assumption that tester channels will contact all the product pins. But after receiving the TMD, manufacturing can use the two processes described in this invention to modify the External I/O test patterns such that they can be applied on testers with fewer test channels.

The present invention recognizes the following aspects of testing using a low pin count tester.

1. ASIC Boundary Scan Design Rules restrict the wiring and logic outboard of the boundary scan latches in such a fashion that the outboard circuitry and the test patterns generated for it are distinctly disciplined and structured. The design rules are defined as follows:

a. In each external test mode, the receiver data signal must be either unconnected or observable (0 and 1) at a Shift Register Latch (SRL) or test output, with at least one signal per I/O observable. The observation may be in a latch of the SRL. This latch is called a receiver boundary latch. Intervening logic is allowed, as long as the path can be sensitized by a test input and/or scannable latch state that also sensitizes the path from the observe clock input to the observe latch, if the observation is at an SRL.

b. In each external test mode, the driver data signal must be controllable (to 0 and 1) from a scannable latch or test input. The latch is called a driver boundary latch. Intervening logic that can be sensitized to an active state is allowed.

c. In each external test mode, the driver enable signal must be controllable (to 0 and 1) from a scannable latch, or test input or must be physcially tied enabled (1). The latch is called an enable boundary latch. Intervening logic that can be sensitized to an active state is allowed.

d. The same latch or test I/O cannot be used as both a receiver boundary latch and a driver boundary latch or as both a receiver boundary and an enable boundary latch. The same latch or test I/O cannot be used a both a driver boundary latch and an enable boundary latch in a single I/O.

e. A receiver boundary latch or test input cannot be used for observing more than one receiver data signal.

f. There must exist a static sensitizing state, which may include test inputs and/or scannable latches, for which rules a, b and c are simultaneously satisfied for all non-tested I/O.

2. External I/O test patterns generated assuming full pin count test for products that use ASIC Boundary Scan Design Rules have the unique characteristics that allow them to be modified and re-simulated such that they can be applied using a "banked" external I/O test methodology.

3. For typical external I/O pins in the parametric test patterns, the ASIC Boundary Scan Design Rules cause the preconditioning of each parametric fault objective on typical external I/O pins to be entirely independent of the preconditioning for other parametric fault objectives. When one test pattern contains the tests of many parametric faults, the preconditioning and test of individual parametric faults can be separated from that original test pattern and regrouped into two or more "banked" test patterns. Thereby, each full pin count test pattern can be separated into "banked" test patterns.

4. The future introductions of other types of external I/O with special interdependencies are highly unlikely to compromise this banking test methodology. This method allows all pins that are continuously contacted plus all pins in a given bank to have stimuli and measurements within the same test pattern. In order to compromise this methodology, the number of external I/O on a product with such an interdependency would have to exceed the number of pins in the union of the group of continuously contacted pins and a "banked" group of pins.

5. Since manufacturing test will assign each of the ASIC product's external I/O pins to banks, the "banking" algorithm can both recognize any interdependencies of the product's external I/O, and also optimize the banked pin groups for the banking implementation being used. When using module test fixtures, the banking can allow for the reuse or modification of existing module test fixtures. Alternately, it can facilitate the design, fabrication and turn around time of a new module test fixture.

6. Differential I/O pins and Voltage Reference I/O pins do place certain constraints on how the pins are placed in "banked" pin groups. External I/O with interdependencies will be "banked" together such that they are simultaneously contacted.

7. ASIC Boundary Scan Design Rules allow the customer's external I/O test patterns to be modified and re-simulated into banked test patterns without need to repeat either test generation or fault machine simulation. The structural nature of the ASIC Boundary Scan Design requires only good machine simulation (GMS) after the full pin count rest patterns and their parametric preconditioning has been separated into "banked" test patterns.

8. The ASIC Boundary Scan Design ensures that when external I/O test patterns are separated into "banked" test patterns and re-simulated, there is no loss of parametric fault coverage.

9. The existing logical test data, physical design data and module description that is currently received by manufacturing test contains all the information required to determine the pin banking, and re-simulate full pin count external I/O test patterns into "banked" external I/O test patterns.

The designer will continue to design the product, run test generation, and submit the external I/O test patterns without knowledge of the banking configuration that will later be determined by manufacturing. Each test in the test patterns may contain any number of stimuli measurements producing a corresponding output on the external I/O pins. As provided by the customer, the external I/O test patterns obtain high parametric fault coverage and require a full pin count tester.

Attention is directed to FIG. 1 which shows the process steps used in the present invention. The first process described below analyzes an ASIC product's physical design data, logical test data, and module description. It recognizes the presence of differential I/O, voltage reference I/O and any other types of I/O that have special banking restrictions. The banking constraints required for these exceptional types of I/O pins is defined to the process by a set of rules. Rules can also be included which define guidelines that allow design and build optimization and reuse of module test fixtures or the programming of the channel assignments within the intermediate banking box. For a high pin count ASIC, this process generates a list of allowable banking configurations for the product Multiple "banking" configurations are possible for each ASIC. With this flexibility, two or more ASIC products can be "banked" in the same configuration. The most general "banked" configuration for ASICs with a common physical image can be used allowing multiple products to share the banking configuration and hardware.

The second described process in accordance with the present invention is the method of modifying the designer' full pin count External I/O test patterns into reduced pin count External I/O test patterns that use the "banked" pin groups. The process creates sets of banked test patterns that conform to the banking configuration defined by the first process. Using banking, the test patterns can be applied on a tester with fewer channels then the product has pins. The resulting test preserves the full parametric fault coverage and test quality of the customer's original test pattern set.

Process 1: Determine Banking

1) Read pin data from the TMD and determine the logical to physical pin correlation from a file that contains the physical location of each logical I/O chip pin.

Working within the "restrictions of banking" as they relate to Test I/O, External I/O, Differential I/O, Voltage Reference I/O, and any other exceptional types of External I/O pins with special interdependencies—define the External I/O "banked" pin subsets required for the specific part being processed.

Refer to a table of existing module test fixtures to identify opportunities for reuse and guidelines that address design optimization for new or modified module test fixtures.

Where an existing module test fixture can be used, generate a list of "banked" pin groups for the product and existing fixture.

2) If a module test fixture with this configuration does not already exist, use these "banked" pin groups as the basis for the design of a new module test fixture or modification of an existing one.

Process 2: Re-simulate External I/O Test Patterns

1) Use the lists of the External I/O "banked" pin groups and the customer's original External I/O test patterns. Make a backup copy of the test patterns. Initiate modification of the original pattern set by replicating a copy of the External I/O test patterns for each "banked" pin group.

2) For each "banked" copy of test patterns:

Remove all the Stimuli on External I/O pins that are not in the "active" bank;

Reset all the Measure Latch Events for which a voltage measurement is obtained wit Dummy Measured Latch Events prior to resimulation; and Reset all the Primary Output Measurements with a "Measurement Unknown" prior to re-simulation of the primary output.

3) Do a Good Machine Simulation on each "banked" copy of the test patterns.

The GMS re-establishes measurements in each "banked" copy of the test patterns.

These new measurements are no longer dependent on any Stimuli on pins in an "inactive" bank.

4) For each "banked" pattern set:

Remove all Primary Output Measurements on "inactive" (out-of-bank) pins.

Every Primary Output Measurement in the original pattern set will be retained in at least one of the "banked" pattern sets. The "banked" copies of the test patterns also contain preconditioning from the Stim Latch Events. The preconditioning from these Stim Latch Events is for the "driver" tests of all the External I/O pins. After the GMS, each of the "banked" copies of the test patterns will contain "driver" test measurements on all the External I/O pins. Each "banked" copy will have these measurements on both its "active" (in-bank) and "inactive" (out-of-bank) pins. Within these "banked" copies, those measurements on the "inactive" (out-of-bank) pins are removed. In one "banked" copy of the test patterns, they are guaranteed to be "active" (in-bank) and thus remain as active measurements. Each measurement need only be done once to preserve the parametric fault coverage of the original pattern set.

5) Remove any tests that contain no measurements on latches or Primary Outputs after being grouped and resimulated 6) Process the resimulated External I/O test patterns with the remainder of the test data on the TMD and build a "banked" Test Program for the existing reduced pin count testers.

The Sum of the Parts.

Every stimulus and measure on an External I/O pin in the original set of test patterns will get applied in at least one of the "banked" test patterns. In turn, all of External I/O Parametric Faults tested by the original test patterns are tested by one of the "banked" copies of the re-simulated External I/O test patterns. Since the ASIC Boundary Scan Design Rules protect the Parametric Faults through the course of this process, the sum of these parts will equal the original whole. Using this invention to bank external I/O test patterns allows high pin count products to be fully tested on low pin count testers. This ASIC design and test method serves to avoid the high costs associated with high pin count testers.

While the invention has been shown and particularly described with reference to a preferred embodiment, it will be understood by those skilled in the art that various changes in form and detail may be made without departing from the spirit and scope of the invention.

What is claimed is:

1. A method for parametric testing of an integrated circuit having a package pin count greater than n on a tester having fewer than n tester channels comprising the steps of:

providing a testing fixture for the integrated circuit capable of coupling a plurality of banked input-output (I/O) pins with the tester;

generating a plurality of external I/O test patterns adapted for a full pin count test;

grouping package pins into banks based on circuit input and output constraints and on the test fixture;

simulating external testing with reduced pin count to remove any test output measurements which are outside of an active bank;

modifying the external I/O test patterns such that more than one set of stimuli may be applied to an external I/O pin; and applying the external I/O test patterns to the integrated circuit package from the tester.

2. The method of claim 1 which includes designing the integrated circuit packages to include boundary scan such that most circuit outputs have their driver and enable signals controlled by scannable boundary latches.

3. The method of claim 2 wherein most circuit inputs have their receiver data observable in scannable boundary latches and with all circuit signal inputs and outputs which do not have boundary latches being included in a bank that is always connected to tester channels.

4. The method of claim 1 which includes the step of analyzing the integrated circuit physical design data and logical test data.

5. The method of claim 4 wherein the grouping of pins includes determining the presence of differential I/O to be banked.

6. The method of claim 5 wherein grouping of pins includes determining the presence of voltage references to be banked.

7. The method of claim 6 wherein grouping of pins includes determining the presence of I/O with banking restrictions.

8. The method of claim 7 which includes determining the multiple banking configurations allowable for the integrated circuit package.

9. The method of claim 8 which includes selecting a banking configuration for the integrated circuit package that can also be used to apply the external tests to other integrated circuits; and allowing the test of several integrated circuits to share the same banking configuration and hardware.

10. A method for parametric testing of an ASIC having a pin counts greater than n on a tester having fewer than n tester channels comprising:

analyzing the ASIC physical design data and logical test data to determine the presence of differential I/O voltage reference I/O and I/O with banking restrictions;

assigning a single tester channel to a banked set of device I/O; and applying testing patterns to the ASIC from the tester having fewer test channels than pins on the ASIC, wherein the testing patterns may be generated subsequent to design and manufacture of the ASIC.

* * * * *